(12) United States Patent
Kiji

(10) Patent No.: US 7,522,487 B2
(45) Date of Patent: Apr. 21, 2009

(54) LIGHT RECEIVING AMPLIFIER CIRCUIT AND OPTICAL PICKUP DEVICE HAVING THE SAME

(75) Inventor: Hitoshi Kiji, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 603 days.

(21) Appl. No.: 11/378,089

(22) Filed: Mar. 17, 2006

(65) Prior Publication Data
US 2006/0220747 A1 Oct. 5, 2006

(30) Foreign Application Priority Data
Mar. 18, 2005 (JP) .............................. 2005-080605

(51) Int. Cl.
G11B 7/00 (2006.01)
(52) U.S. Cl. ................. 369/44.41; 369/120; 369/124.01
(58) Field of Classification Search ........................ None
See application file for complete search history.

(56) References Cited

U.S. PATENT DOCUMENTS 5,936,986 A * 8/1999 Cantatore et al. ........ 372/38.02
6,072,609 A * 6/2000 Masuda ....................... 398/27

FOREIGN PATENT DOCUMENTS

| JP | 11-296892 A | 10/1999 |
| JP | 2000-332546 A | 11/2000 |
| JP | 2000-353925 A | 12/2000 |

* cited by examiner

*Primary Examiner*—Muhammad N. Edun
(74) *Attorney, Agent, or Firm*—Morrison & Foerster LLP

(57) ABSTRACT

In a light receiving amplifier circuit, a dummy amplifier has an identical structure with an IV amplifier except that the dummy amplifier is not connected to a light receiving element and includes a capacitor, i.e., a band limiting capacitor. Further, the capacitor is connected between the collector of the grounded-emitter transistor Tr and GND.

18 Claims, 6 Drawing Sheets

LIGHT RECEIVING AMPLIFIER CIRCUIT AND OPTICAL PICKUP DEVICE HAVING THE SAME

This Nonprovisional application claims priority under 35 U.S.C. § 119(a) on Patent Application No. 80605/2005 filed in Japan on Mar. 18, 2005, the entire contents of which are hereby incorporated by reference.

FIELD OF THE INVENTION

The present invention relates to a light receiving amplifier circuit mounted on an optical pickup device for reproducing/recording an optical disk.

BACKGROUND OF THE INVENTION

An optical disk recording/reproducing device includes: a light emitting element which irradiates a laser beam for reproducing/recording onto an optical disk; and a light receiving amplifier element for receiving reflected light from the optical disk. The light amplifier element contains a light receiving element and a light receiving amplifier circuit. The light receiving element receives the reflected light or monitors a laser beam emitted from a laser light source provided as a light source for recording-use and reproducing-use, and converts the light signal into an electronic signal. The light receiving amplifier circuit amplifies the electronic signal (photoelectric transfer signal) thus converted from a light signal by the light receiving element.

FIG. 4 is a view schematically illustrating a structure of an optical pickup device 101, which constitutes a recording and reproducing optical system of a recording and reproducing device for an optical disk 102. The optical pickup device 101 includes a laser diode 103, collimator lenses 104 and 106, a beam splitter 105, an objective lens 107, a spot lens 108, a light receiving amplifier element 109, and light receiving amplifier elements 110 and 111. There may be a case where only one of the light receiving amplifier elements 110 and 111 is provided.

A laser light emitted from the laser diode 103, i.e., a light emitting element serving as a light source for recording-use and reproducing-use, is converted into parallel light by the collimator lens 104. The light path of the parallel light is deflected at 90° by the beam splitter 105, so that the light thus deflected is directed onto the optical disk 102 via the collimator lens 106 and the objective lens 107. Further, the reflected light from the optical disk 102 is transmitted through the objective lens 107, the collimator lens 106, and the beam splitter 105. The reflected light is converged by the spot lens 108 onto the light receiving amplifier element 109. The light receiving amplifier element 109 reproduces an information signal based on the incident light signal, while generating a tracking servo signal and a focusing servo signal. These signals are outputted to a signal processing circuit and a control circuit (not shown). During recording, the light irradiated from the laser diode 103 is modulated according to data to be written. The wavelength of the laser diode 103 is determined depending on a type of the optical disk 102.

In an optical system having the above structure, the light receiving amplifier element 110 is provided in the vicinity of the laser diode 103. The light receiving amplifier element 111 is provided on the opposite side of the laser diode 103, while the beam splitter 105 is disposed in between. The light receiving amplifier elements 110 and 111 receive and monitor part of the outputted light from the laser diode 103, and give feedback to the laser diode 103. This allows the intensity of the laser light to be suitably adjusted.

FIG. 5 illustrates a circuitry of a light receiving amplifier circuit 121 provided in the conventional light receiving amplifier elements 109, 110 and 111.

The light receiving amplifier circuit 121 includes a photodiode PD1, a current-to-voltage conversion circuit (hereinafter referred to as IV amplifier) 122, a reference voltage supplying amplifier (hereinafter referred to as dummy amplifier) 123, and a differential amplifier circuit 124.

The photodiode (light receiving element) PD1 has an anode connected to GND, and a cathode connected to a base of a transistor Tr101.

The IV amplifier 122 includes an amplifier circuit A101, an output circuit B101, and a plurality of feedback resistors Rf1, Rf2, . . . Rfn. The amplifier circuit A101 is constituted by a grounded-emitter amplifier circuit, and the output circuit B101 is constituted by an emitter follower circuit. The IV amplifier 122 converts a current generated by the photodiode PD1 into a voltage, and outputs the voltage thus converted.

The amplifier circuit A101 includes the transistor Tr101 and a constant current source Ica101. The transistor (grounded-emitter transistor) Tr101 is a transistor of NPN type. As noted above, the transistor Tr101 has the base connected to the cathode of the photodiode PD1. Further, the transistor Tr101 has an emitter connected to the GND and a collector connected to the constant current source Ica101 serving as an active load. An input signal is supplied via the base of the transistor Tr101 in the amplifier circuit A101, i.e., the base serves as an input terminal of the IV amplifier 122. An output signal is outputted via the collector (output node) of the transistor Tr101 in the amplifier circuit A101.

The output circuit B101 includes a transistor Tr111 and a constant current source Icb101. The transistor Tr111 is a transistor of NPN type, and has a base connected to the collector of the transistor Tr101, a collector connected to a power source Vcc, and an emitter connected to the constant current source Icb101 serving as an active load. The emitter of the transistor Tr111 serves as an output terminal of the IV amplifier 122. As such, in the IV amplifier 122, the output terminal obtains an output voltage which varies depending on an output signal from the output node of the amplifier circuit A101.

In FIG. 5, basically, an output signal of the IV amplifier is not affected by a subsequent load. Rather, such an output signal is determined according to (i) a voltage VBE of the grounded-emitter Tr and (ii) (a base current of the grounded-emitter Tr)×(the feedback resistor Rf).

Base currents of the transistors Tr101, Tr111, Tr102 and Tr112 are determined by the constant current sources Ica101, Icb101, Ica102 and Icb102 (each base current becomes 1/hFE of the value of its corresponding constant current source), respectively.

Output terminal voltages of the IV amplifier, i.e., emitter voltages of Tr111 and Tr112, are given as follows.

An output voltage during no light emission is found.

$$IB(Tr101)=(Ica101-IB(Tr111)/hFE(Tr101)=Ica101/hFE(Tr101)$$  [Equation A1].

By using the [Equation A1], an output voltage of the IV amplifier 122 during no light emission is found by the following equation A2:

An output voltage of the IV amplifier 122 during no light emission=$VBE(Tr101)+(IB(Tr101)\times Rf)=VBE(Tr101)+(Ica101/hFE(Tr101)\times Rf)$  [Equation A2], where VBE denotes a voltage between the base and the emitter, IB denotes a base current, and hFE denotes a current amplification factor of the transistor. Further, the following relationship is satisfied:

$$Ica101 \gg IB(Tr111).$$

Similarly, an output voltage of the dummy amplifier 123 during no light emission is found as follows.

An output voltage of the IV amplifier 123 during no
light emission=$VBE(Tr102)+(IB(Tr102)\times Rf)=$
$VBE(Tr102)+(Ica102/hFE(Tr102)\times Rf)$  [Equation A3].

Basically, [Equation A2] is equal to [Equation A3].

An output voltage during receiving light is found by the following equation A4:

An output voltage of the IV amplifier 122 during
receiving light=[an output voltage during no light
emission]+$[IPD \times Rf]$  [Equation A4], where IPD denotes a photocurrent during receiving light.

In the IV amplifier 122, the feedback resistors Rf1, Rf2, ... Rfn are mutually connected in parallel between the output terminal and the base of the transistor Tr101 of the amplifier circuit A101. Thus feedback paths are provided between the output terminal and the base of the transistor Tr101. Further, in the feedback paths, switches sw1, sw2, ... swn are inserted and connected in series with the feedback resistors Rf1, Rf2, ... Rfn, respectively (hereinafter, the feedback resistors may be generically referred to as mere feedback resistor(s) Rf). With the switches, the feedback resistors. Rf1, Rf2, ... Rfn are switched so that either one of the resistors is used. This allows switching of a gain of the light receiving amplifier circuit 121. Such switching operation is done according to (i) whether the optical disk 102 is read out or written or (ii) a variation in inputted light to the light receiving amplifier circuit 121 according to a type of the optical disk 102 (e.g. DVD-R, DVD-RW, DVD-RAM, etc.). This causes the feedback resistor(s) Rf to be selected, thereby switching of the gain of the light receiving amplifier circuit 121.

The dummy amplifier 123 has the same structure as the IV amplifier 122 except that the dummy amplifier 123 has no connection with a light receiving element and contains a capacitor C1 explained later. The dummy amplifier 123 includes an amplifier circuit A102 and an output circuit B102, which correspond to the amplifier circuit A101 and the output circuit B101, respectively. Further, the dummy amplifier 123 includes feedback resistors Rf1, Rf2, ... Rfn, which are the same as those provided in the IV amplifier 122. The amplifier circuit A102 and the output circuit B102 include the transistors Tr102 and Tr112, respectively, which correspond to the transistors Tr101 and Tr111, respectively. Further, the amplifier circuit A102 and the output circuit B102 include the constant current sources Ica102 and Icb102, respectively, which correspond to the constant current sources Ica101 and Icb101, respectively. The transistors Tr101 and Tr102 have the same electric characteristics, while the transistors Tr111 and Tr112 have the same electric characteristics. Further, the constant current sources Ica101 and Ica102 output the same current, i.e., Ica, while the constant current sources Icb101 and Icb102 output the same current, i.e., Icb.

The dummy amplifier 123 only outputs and supplies a reference voltage to the following differential amplifier circuit 124. Therefore, the dummy amplifier 123 does not need to amplify the inputted light, requiring no connection with a light receiving element. Since the dummy amplifier 123 has substantially the same structure as the IV amplifier 122 as noted above, the dummy amplifier 123 outputs a reference voltage equal to an output voltage of the IV amplifier 122 during no light emission. As such, the dummy amplifier 123 contributes to an improvement in the characteristics of the output voltage of the light receiving amplifier circuit 122 during no light emission (offset voltage).

The differential amplifier circuit 124 receives an output voltage of the IV amplifier 122 and an output voltage of the dummy amplifier 123, and amplifies a difference therebetween. The differential amplifier circuit 124 includes an operational amplifier OP and resistors R101 through R104. The resistor R101 is connected between the output terminal of the IV amplifier 122 and a non-inverting input terminal of the operational amplifier OP. The resistor R102 is connected between a terminal REF and the non-inverting input terminal of the operational amplifier OP. An external reference voltage Vref is supplied via the terminal REF. The resistor R103 is connected between an output terminal of the dummy amplifier 123 and an inverting input terminal of the operational amplifier OP. The resistor 104 is connected between a terminal OUT and the inverting input terminal of the operational amplifier OP. An output voltage Vo of the differential amplifier circuit 124 is outputted via the terminal OUT.

In the differential amplifier circuit 124, the following relationship is satisfied:

$$Vo=Vref+(R2/R1)\times(V1-V2),$$

where V1 denotes an output voltage of the IV amplifier 122, V2 denotes an output voltage of the dummy amplifier 123, R1 is a resistance of the resistors R101 and R103, and R2 is a resistance of the resistors R102 and R104.

Since the dummy amplifier 123 does not require a high speed response, the dummy amplifier 123 has a capacitor C1 serving as a band limiting capacitor between an input and an output terminals (between a base and a collector of the transistor Tr102) of the amplifier circuit A102, i.e., grounded-emitter amplifier circuit. Due to the mirror effect, the capacitor C1 of FIG. 5 is equivalent to a capacitor of FIG. 6 which is provided between an input terminal of a grounded-emitter amplifier circuit (a base of a transistor Tr102 and GND, and which has a capacitance of $(C1\times(1+(VA/VT)))$. Thus, the capacitor C1 limits a response of the dummy amplifier 123 and reduces a noise at high frequencies. Specifically, when assuming that each output impedance of the emitter follower circuits, i.e. output circuits B101 and B102, is fully low and an that early voltage of the NPN transistor in use is fully high, a time constant CR(C1) derived from the capacitor C1 is expressed by the following equation 1:

CR(C1)=(input resistance of dummy amplifier)×(capacitance between base and GND of grounded-emitter transistor)=Rf×C1  [Equation 1], where Rf is the feedback resistance. Thus, the capacitor C1 serves as a filter having the time constant, and contributes to band limiting and noise reduction of the dummy amplifier. When commonly used values are adopted: Rf=10 kΩ; and C1=5 pF, CR(C1) is 50 ns, and a cutoff frequency is expressed by the following equation:

Cutoff frequency=$1/(2\times\pi\times CR)$=3.18 MHz.

In FIG. 5, the light directed to the photodiode PD1 varies according to whether reproducing or recording is made to the optical disk 102, or according to the type of the optical disk 102. Therefore, as noted above, according to the light receiving amplifier circuit 121, a plurality of feedback resistors are provided and a feedback resistor (which causes no output saturation, or which is capable of extracting a signal) Rf is appropriately selected by switching the switches. Particularly, as to a DVD disk, in order to extract a signal recorded in the optical disk (disk information or other information), a gain required for reproducing may be temporarily required at the time of recording. That is, during recording operation, a DVD disk requires switching between a feedback resistor for recording-use (low gain) and a feedback resistor for reproducing-use. In this case, for high-speed recording, it is desirable that it takes a shorter time period from the time when the gain is switched to the time when the circuit is stabilized so as to output a signal (hereinafter referred to as stabilization time).

In the light receiving amplifier circuit 121 shown in FIG. 5, it is the dummy amplifier whose response is limited by the capacitor C1 that exhibits the slowest response. The stabilization time for a voltage across the capacitor C1 affects the stabilization time for the light receiving amplifier circuit 121. A variation DVc in the voltages Vc across the capacitor C1 at the time of switching the feedback resistor Rf1 to Rf2 is found by considering a circuitry of FIG. 6 which is equivalent to that of FIG. 5 and in which a capacitor having a capacitance of $C1 \times (1+(VA/VT))$ is connected between the GND and the input terminal (base) of the amplifier circuit A102 of the grounded-emitter amplifier circuit as shown in FIG. 6. Specifically, the variation DVc is expressed by the following equation 2:

$$DVc = DVbe \times (1 + \exp(-t/((C1 \times (1+(VA/VT))) \times Rf2)))$$ [Equation 2], where DVbe is a variation in the base voltages of the transistor Tr101 before and after switching the gain, t is an elapsed time after switching the gain, VA is the early voltage of the transistor, VT is a thermal voltage of the transistor (26 mV at 27° C.).

Further, the following relationship is given, $$t = C1 \times Rf2 \times (1+(VA/VT)) \times \ln(1/(1-(DVc/DVbe)))$$ [Equation 3].

For example, it takes a time of t (95%) for DVc to reach 95% of the voltage variation DVbe, and the time t(95%) satisfies the following equation:

$$t(95\%) = C1 \times Rf2 \times (1+(VA/VT)) \times \ln(1/(1-0.95)) = 3 \times (1+(VA/VT)) \times C1 \times Rf2.$$

When commonly used 50 V, 26 mV, 5 pF, and 10 kΩ are adopted as the variables VA, VT, C1, and Rf2, respectively, t(95%) becomes 288 μs, which is significantly large as compared to 0.222 μs corresponding to a double speed signal band (4.5 MHz) of a DVD. This gives rise to the fact that the stabilization time is too long to extract a signal contained in the disk, even if a feedback resistor Rf (i.e., a gain) is switched during recording operation. Therefore, a problem to be solved is to reduce the stabilization time. As to the aforementioned circuit, refer to the Japanese Unexamined Patent Publication, No. 332546/2000 (Tokukai 2000-332546, publication date: Nov. 30, 2000) and the Japanese Unexamined Patent Publication, No. 296892/1999 (Tokukai 1999-296892, publication date: Oct. 29, 1999).

SUMMARY OF THE INVENTION

The present invention is made in view of the foregoing problems, and an object of the present invention is to provide a light receiving amplifier circuit capable of shortening a stabilization time while having a band limiting capacitor, and an optical pickup device having the light receiving amplifier circuit.

To attain the above object, a light receiving amplifier circuit of the present invention includes: a light receiving element which converts received light into a current and outputs the current thus converted; a current-to-voltage conversion circuit which converts the output current of the light receiving element into a voltage; a reference voltage supplying amplifier having an identical structure with the current-to-voltage conversion circuit except that the light receiving element is not connected and a band limiting capacitor is provided; and a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including: a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and a plurality of feedback resistors being provided in parallel on feedback paths from the output terminal to the base so as to be selectively used, the band limiting capacitor being connected between the output node of the grounded-emitter amplifier circuit and a grounded point where the emitter is grounded.

According to the invention, in the reference voltage supplying amplifier, a time constant determined by a band limiting capacitance and an impedance at the output node of the grounded-emitter amplifier circuit is large. The band limiting capacitance is given by a band limiting capacitor connected between the output node of the grounded-emitter amplifier circuit and the grounded point where the emitter is grounded. This allows the band limiting capacitor to sufficiently reduce a cutoff frequency of the reference voltage supplying amplifier, thereby sufficiently realizing band limiting and noise reduction in the reference voltage supplying amplifier. Further, the stabilization time at the time of switching a feedback resistor is sufficiently small and determined by (i) a capacitance of the band limiting capacitor, (ii) a voltage variation at the output node of the grounded-emitter amplifier circuit at the time of switching the feedback resistor, and (iii) a current to be flowed into the output node.

With the arrangement, it is possible to realize a light receiving amplifier circuit capable of shortening the stabilization time while having a band limiting capacitor.

To attain the above object, a light receiving amplifier circuit of the present invention includes: a light receiving element which converts received light into a current and outputs the current thus converted; a current-to-voltage conversion circuit which converts the output current of the light receiving element into a voltage; a reference voltage supplying amplifier having an identical structure with the current-to-voltage conversion circuit except that the light receiving element is not connected and a band limiting capacitor is provided; and a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including: a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and a plurality of feedback resistors being provided in parallel on feedback paths from the output terminal to the base so as to be selectively used, the current-to-voltage conversion circuit and the reference voltage supplying amplifier each further including a bias-use constant current source for supplying a bias current to the base, and the band limiting capacitor being connected between the base and the output node of the grounded-emitter amplifier circuit.

According to the invention, a current flowing through the feedback resistors is set to 0 by supplying a bias current to the base of the grounded-emitter transistor by means of the bias-use constant current source. By setting the current flowing through the feedback resistors to 0, a base current of the grounded-emitter transistor is fixed to an output current of the bias-use constant current source. This allows the voltage between the base and the emitter of the grounded-emitter transistor to be always constant. That is, the base potential of the grounded-emitter transistor is not varied by switching the feedback resistors. This allows the stabilization time to be 0 because switching the feedback resistors generates no charging and discharging currents in the band limiting capacitor, which is connected between the base of the grounded-emitter transistor and the grounded point where the emitter is grounded.

With the arrangement, it is possible to realize a light receiving amplifier circuit capable of shortening the stabilization time while having a band limiting capacitor.

To attain the above object, a light receiving amplifier circuit of the present invention includes: a light receiving element which converts received light into a current and outputs the current thus converted; a current-to-voltage conversion circuit which converts the output current of the light receiving element into a voltage; a reference voltage supplying amplifier having an identical structure with the current-to-voltage conversion circuit except that the light receiving element is not connected and a band limiting capacitor is provided; and a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including: a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and a plurality of feedback resistors being provided in parallel on feedback paths from the output terminal to the base so as to be selectively used, the current-to-voltage conversion circuit and the reference voltage supplying amplifier each further including a bias-use constant current source for supplying a bias current to the base, and the band limiting capacitor being connected between the base and a grounded point where the emitter is grounded.

According to the invention, a current flowing through the feedback resistors is set to 0 by supplying a bias current to the base of the grounded-emitter transistor by means of the bias-use constant current source. By setting the current flowing through the feedback resistors to 0, a base current of the grounded-emitter transistor is fixed to the output current of the bias-use constant current source. This allows the voltage between the base and the emitter of the grounded-emitter transistor to be always constant. Further, since an output voltage of the reference voltage supplying amplifier is always equal to a constant voltage between the base and the emitter of the grounded-emitter transistor, switching the feedback resistors do not change voltage distribution and current distribution of the reference voltage supplying amplifier, enabling to realize a constant potential at the output node of the grounded-emitter amplifier circuit. That is, the base potential of the grounded-emitter transistor and the potential at the output node of the grounded-emitter amplifier circuit are not varied by switching the feedback resistors. This allows the stabilization time to be 0 because switching the feedback resistors generates no charging and discharging currents in the band limiting capacitor, which is connected between the base of the grounded-emitter transistor and the output node of the grounded-emitter amplifier circuit.

With the arrangement, it is possible to realize a light receiving amplifier circuit capable of shortening the stabilization time while having a band limiting capacitor.

To attain the above object, a light receiving amplifier circuit of the present invention includes: a light receiving element which converts received light into a current and outputs the current thus converted; a current-to-voltage conversion circuit which converts the output current of the light receiving element into a voltage; a reference voltage supplying amplifier having an identical structure with the current-to-voltage conversion circuit except that the light receiving element is not connected and a band limiting capacitor is provided; and a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including: a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and a plurality of feedback resistors being provided in parallel on feedback paths from the output terminal to the base so as to be selectively used, the current-to-voltage conversion circuit and the reference voltage supplying amplifier each further including a bias-use constant current source for supplying a bias current to the base, and the band limiting capacitor being connected in parallel to the feedback resistors.

According to the invention, a current flowing through the feedback resistors is set to 0 by supplying a bias current to the base of the grounded-emitter transistor by means of the bias-use constant current source. By setting the current flowing through the feedback resistors to 0, a base current of the grounded-emitter transistor is fixed to the output current of the bias-use constant current source. This causes no electric charge in the band limiting capacitor connected in parallel to the feedback resistors. Further, no voltage occurs in any band limiting capacitor regardless of connection or disconnection to the feedback resistor. Thus, the stabilization time becomes 0.

With the arrangement, it is possible to realize a light receiving amplifier circuit capable of shortening the stabilization time while having a band limiting capacitor.

To attain the above object, an optical pickup device of the present invention includes the light receiving amplifier circuit as a light receiving amplifier circuit used for optical pickup of an optical disk.

According to the invention, the optical pickup device includes a light receiving amplifier circuit, which is capable of shortening the stabilization time while having a band limiting capacitor. This enables a high-speed response when received light of a light receiving element needs to be amplified while the feedback resistors are switched.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

Figure 1:
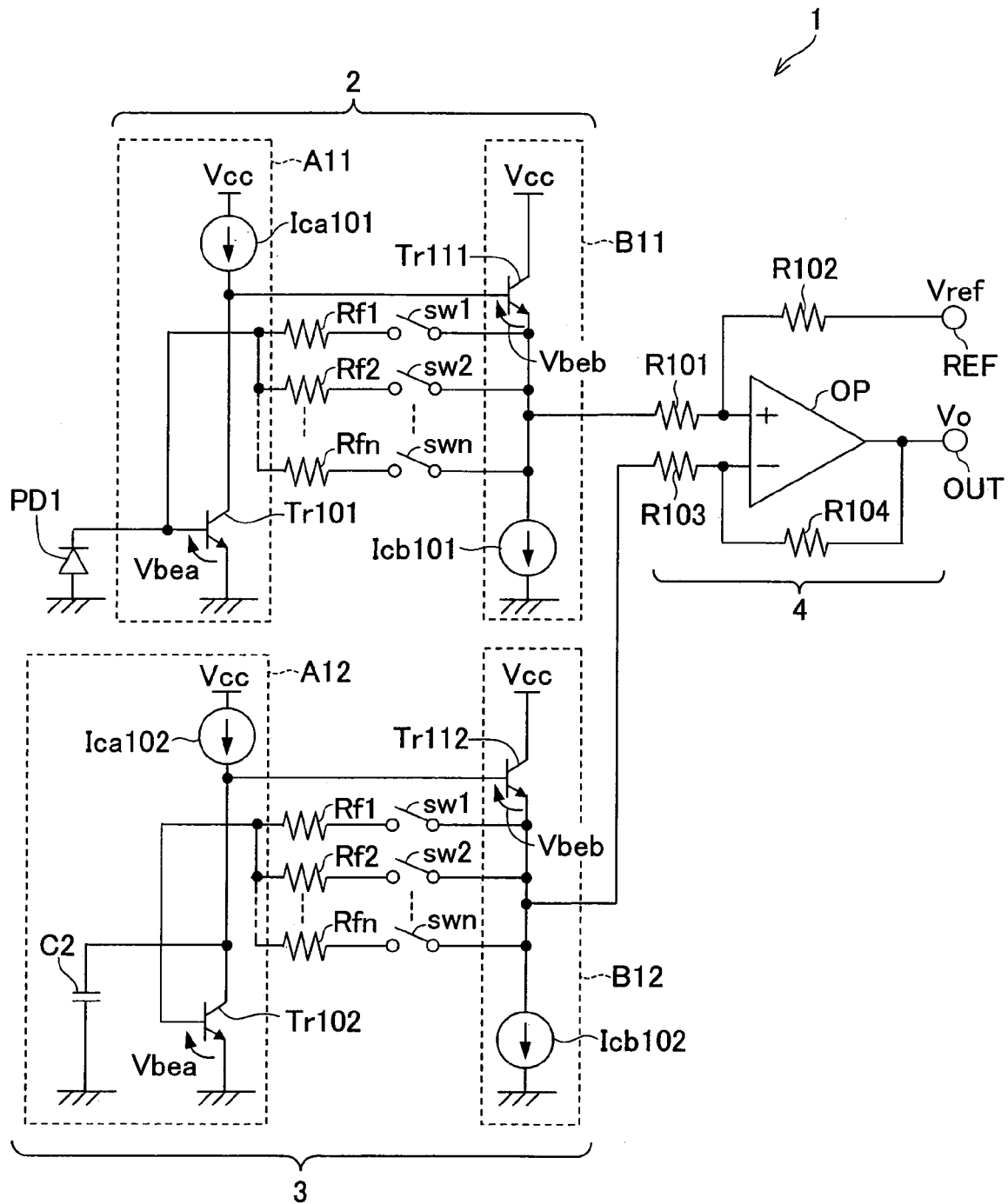
FIG. 1 is a circuit diagram illustrating a circuitry of a light receiving amplifier circuit according to a first embodiment of the present invention.
Figure 4:
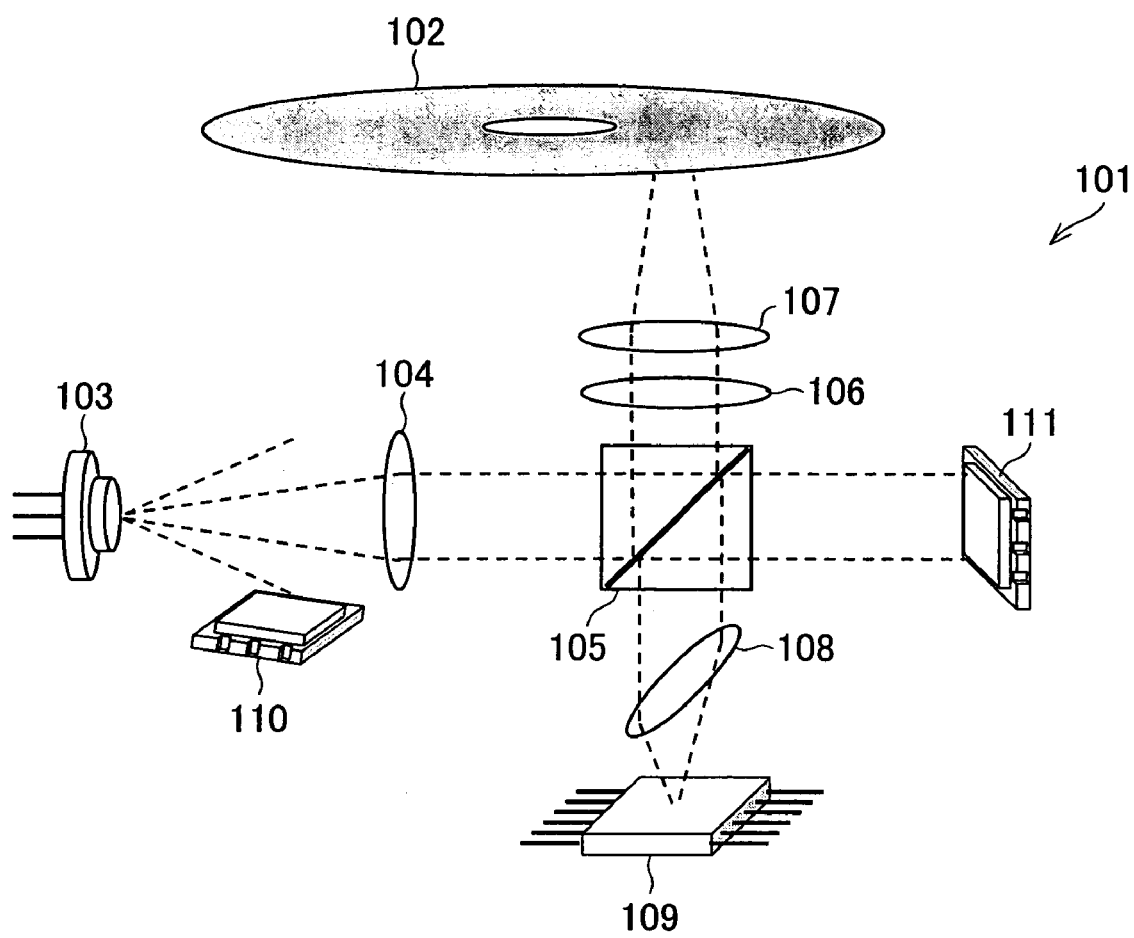
FIG. 4 is a view illustrating a structure of an optical pickup device.

With reference to FIGS. 1 and 4, an embodiment of the present invention is described below.

FIG. 1 illustrates a circuitry of a light receiving amplifier circuit 1 of the present embodiment. The light receiving amplifier circuit 1 can be provided in the light receiving amplifier elements 109, 110 and 111 of the optical pickup device 101 shown in FIG. 4.

The light receiving amplifier circuit 1 includes a photodiode PD1, an IV amplifier 2, a dummy amplifier 3, and a differential amplifier circuit 4.

The photodiode (light receiving element) PD1 has an anode connected to GND, and a cathode connected to a base of a transistor Tr101.

The IV amplifier 2 includes an amplifier circuit A11, an output circuit B11, and a plurality of feedback resistors Rf1, Rf2, . . . Rfn. The amplifier circuit A11 is constituted by a grounded-emitter amplifier circuit, and the output circuit B11 is constituted by an emitter follower circuit. The IV amplifier 2 converts a current generated by the photodiode PD1 into a voltage and outputs the voltage thus converted.

The amplifier circuit A11 includes the transistor Tr101 and a constant current source Ica101. The transistor (grounded-emitter transistor) Tr101 is a transistor of NPN type. As noted above, the transistor Tr101 has the base connected to the cathode of the photodiode PD1. Further, the transistor Tr101 has an emitter connected to the GND and a collector connected to the constant current source Ica101 serving as an active load. An input signal is supplied via the base of the transistor Tr101 in the amplifier circuit A11, i.e., the base serves as an input terminal of the IV amplifier 2. An output signal is outputted via the collector (output node) of the transistor Tr101 in the amplifier circuit A11.

The output circuit B11 includes a transistor Tr111 and a constant current source Icb101. The transistor Tr111 is a transistor of NPN type, and has a base connected to the collector of the transistor Tr101, a collector connected to a power source Vcc, and an emitter connected to the constant current source Icb101 serving as an active load. The emitter of the transistor Tr111 serves as an output terminal of the IV amplifier 2. As such, in the IV amplifier 2, the output terminal obtains an output voltage which varies depending on an output signal from the output node of the amplifier circuit A11.

In FIG. 1, basically, an output of the IV amplifier is not affected by a subsequent load. Rather, such an output signal is determined according to (i) a voltage VBE of the grounded-emitter Tr and (ii) (a base current of the grounded-emitter Tr)×(the feedback resistor Rf).

Base currents of the transistors Tr101, Tr111, Tr102 and Tr112 are determined by the constant current sources Ica101, Icb101, Ica102 and Icb102 (each base current becomes 1/hFE of the value of its corresponding constant current source), respectively.

Output terminal voltages of the IV amplifier, i.e., emitter voltages of Tr111 and Tr112, are given as follows.

An output voltage during no light emission is found.

$$IB(Tr101)=(Ica101-IB(Tr111)/hFE(Tr101)=Ica101/hFE(Tr101) \quad \text{[Equation A1]}.$$

By using the [Equation A1], an output voltage of the IV amplifier 2 during no light emission is found by the following equation A2:

$$\text{An output voltage of the IV amplifier 2 during no light emission}=VBE(Tr101)+(IB(Tr101)\times Rf)= VBE(Tr101)+(Ica101/hFE(Tr101)\times Rf) \quad \text{[Equation A2]},$$

where VBE denotes a voltage between the base and the emitter, IB denotes a base current, and hFE denotes a current amplification factor of the transistor. Further, the following relationship is satisfied:

$$Ica101 \gg IB(Tr111).$$

Similarly, an output voltage of the dummy amplifier 3 during no light emission is found as follows.

$$\text{An output voltage of the IV amplifier 3 during no light emission}=VBE(Tr102)+(IB(Tr102)\times Rf)= VBE(Tr102)+(Ica102/hFE(Tr102)\times Rf) \quad \text{[Equation A3]}.$$

Basically, [Equation A2] is equal to [Equation A3].

An output voltage during receiving light is found by the following equation A4:

$$\text{An output voltage of the IV amplifier 2 during receiving light}=[\text{an output voltage during no light emission}]+[IPD \times Rf] \quad \text{[Equation A4]},$$

where IPD denotes a photocurrent during receiving light.

In the IV amplifier 2, in order to feed back the emitter potential to its input terminal, the feedback resistors Rf1, Rf2, . . . Rfn are mutually connected in parallel between the output terminal and the base of the transistor Tr101 of the amplifier circuit A11. Thus, feedback paths are provided between the output terminal and the base of the transistor Tr101. Further, in the feedback paths, switches sw1, sw2, . . . swn are inserted and connected in series with the feedback resistors Rf1, Rf2, . . . Rfn, respectively. With the switches, the feedback resistors Rf1, Rf2, . . . Rfn are switched so that either one of the resistors is used. This allows switching of a gain of the light receiving amplifier circuit 1. Such switching operation is done according to (i) whether an optical disk 102 is read out or written or (ii) a variation in inputted light to the light receiving amplifier circuit 1 according to a type of the optical disk 102 (e.g. DVD-R, DVD-RW, DVD-RAM, etc.). This causes the feedback resistor(s) Rf to be selected, thereby switching the gain of the light receiving amplifier circuit 1.

The dummy amplifier 3 has the same structure as the IV amplifier 2 except that the dummy amplifier 3 has no connection with a light receiving element and contains a capacitor C2 explained later. The dummy amplifier 3 includes an amplifier circuit A12 and an output circuit B12, which correspond to the amplifier circuit A11 and the output circuit B11, respectively. Further, the dummy amplifier 3 includes feedback resistors Rf1, Rf2, . . . Rfn, which are the same as those provided in the IV amplifier 2. The amplifier circuit A12 and the output circuit B12 include the transistors Tr102 and Tr112, respectively, which correspond to the transistors Tr101 and Tr111, respectively. Further, the amplifier circuit A12 and the output circuit B12 include the constant current sources Ica102 and Icb102, respectively, which correspond to the constant current sources Ica101 and Icb101, respectively. The transistors Tr101 and Tr102 have the same electric characteristics, while the transistors Tr111 and Tr112 have the same electric characteristics. Further, the constant current sources Ica101 and Ica102 output the same current, i.e., Ica, while the constant current sources Icb101 and Icb102 output the same current, i.e., Icb.

The dummy amplifier 3 only outputs and supplies a reference voltage to the following differential amplifier circuit 4. Therefore, the dummy amplifier 3 does not need to amplify the inputted light, requiring no connection with a light receiving element. Since the dummy amplifier 3 has substantially the same structure as the IV amplifier 2 as noted above, the dummy amplifier 3 outputs a reference voltage equal to an output voltage of the IV amplifier 2 during no light emission. As such, the dummy amplifier 3 contributes to an improvement in the characteristics of the output voltage of the light receiving amplifier circuit 1 during no light emission (offset voltage).

The differential amplifier circuit 4 receives an output voltage of the IV amplifier 2 and an output voltage of the dummy amplifier 3, and amplifies a difference therebetween. The differential amplifier circuit 4 includes an operational amplifier OP and resistors R101 through R104. The resistor R101 is connected between the output terminal of the IV amplifier 2 and a non-inverting input terminal of the operational amplifier OP. The resistor R102 is connected between a terminal REF and the non-inverting input terminal of the operational amplifier OP. An external reference voltage Vref is supplied via the terminal REF. The resistor R103 is connected between an output terminal of the dummy amplifier 3 and an inverting input terminal of the operational amplifier OP. The resistor 104 is connected between a terminal OUT and the inverting input terminal of the operational amplifier OP. An output voltage Vo of the differential amplifier circuit 124 is outputted via the terminal OUT.

In the differential amplifier circuit 4, the following relationship is satisfied:

$$Vo = Vref + (R2/R1) \times (V1 - V2),$$

where V1 denotes an output voltage of the IV amplifier 2, V2 denotes an output voltage of the dummy amplifier 3, R1 is a resistance of the resistors R101 and R103, and R2 is a resistance of the resistors R102 and R104.

Further, the dummy amplifier 3 includes a band limiting capacitor, i.e., a capacitor C2. The capacitor C2 is connected between the GND and a collector of the transistor Tr102, i.e., output node of the grounded-emitter amplifier circuit. Here, an impedance of the collector terminal becomes a parallel resistance of (i) an output impedance ro of the grounded-emitter amplifier circuit, (ii) an input impedance ri of the output circuit B12, i.e., emitter follower circuit, and (iii) an output resistance roia of the constant current source Ica102.

Generally, (i) the constant current sources Ica101, Ica102 and (ii) the constant current sources Icb101, Icb102 are realized by respective current mirror circuits using transistors. Further, the current mirror circuits have output resistances of VA/Ica and VA/Icb, respectively (VA is an early voltage of the transistor). Thus, the following relationships are given, $$ro = VA/Ica, \qquad [\text{Equation 4}]$$

$$roia = VA/Ica, \qquad [\text{Equation 5}]$$

$$\begin{aligned} ri &= (hFE \times VT/Icb) + ((1 + hFE) \times roib) \\ &= (hFE \times VT/Icb) + ((1 + hFE) \times VA/Icb) \\ &= (1 + hFE) \times VA/Icb \\ &\quad (\text{when satisfying the relationship: } VA \gg VT)), \end{aligned} \qquad [\text{Equation 6}]$$

where hFE is a direct current amplification factor.

Based on the equations, the following relationship is found, $$ri \gg ro = roia.$$

Thus, an impedance r of the collector terminal is expressed as follows, $$\begin{aligned} r &= ro \,//\, roia \,//\, ri \\ &= ro \,//\, roia \\ &= VA/(Ica \times 2), \end{aligned} \qquad [\text{Equation 7}]$$

where // indicates a parallel resistance.

Accordingly, a time constant CR(C2) of the capacitor C2 connected to the collector terminal of the transistor Tr102 is expressed by the following equation 8:

$$CR(C2) = C2 \times VA/(Ica \times 2) \qquad [\text{Equation 8}].$$

When commonly used values are adopted: C2=5 pF; VA=50V; and Ica=100 μA, CR(C2) becomes 1250 ns, and the cutoff frequency is expressed by $1/(2 \times \pi \times CR(C2)) = 0.12$ MHz, which is significantly small as compared to the cutoff frequency 3.18 MHz derived from [Equation 1] in FIG. 5. This contributes to band limiting and noise reduction in the dummy amplifier 3.

Further, a stabilization time t is determined based on (i) a collector voltage variation ΔVc at the time of switching a gain and (ii) a current Ica of the constant current source Ica102, as expressed by the following equation 9:

$$t = C2 \times \Delta Vc/Ica \qquad [\text{Equation 9}].$$

Further, a collector voltage Vc is determined by the following equation 10:

$$\begin{aligned} Vc &= Vbea + (Rf \times Iba) + Vbeb \\ &= Vbea + (Rf \times Ica/hFE) + Vbeb, \end{aligned} \qquad [\text{Equation 10}]$$

where Vbea is a base-emitter voltage of the transistor Tr102, Iba is a base current of the transistor 102, Rf is a resistance of the feedback resistor Rf in use, and Vbeb is a base-emitter voltage of the transistor Tr112.

When variations in Vbea and Vbeb are ignored as minute values, the collector voltage variation ΔVc, obtained at the time of switching the feedback resistor from Rf1 to Rf2, is given by the following equation 11:

$$\Delta Vc = (Rf2 - Rf1) \times (Ica/hFE) \qquad [\text{Equation 11}],$$

where Rf1 is a resistance of the feedback resistor Rf1, and Rf2 is a resistance of the feedback resistor Rf2.

When [Equation 11] is substituted into [Equation 9], the following relationship is found, $$t = (C2/Ica) \times (Rf2 - Rf1) \times (Ica/hFE) \quad \text{[Equation 12]}$$
$$= (C2/hFE) \times (Rf2 - Rf1).$$

When commonly used values are adopted: C2=5 pF; hFE=100; Rf2=10 kΩ; and Rf1=1 kΩ, t becomes 0.45 ns, which is significantly small as compared to 0.222 μs corresponding to a double speed signal band (4.5 MHz) of a DVD. This allows switching of a feedback resistor (gain) even during recording operation.

As described above, in the light receiving amplifier circuit 1 of the present embodiment, the dummy amplifier 3 has a large time constant CR(C2), which is determined by a capacitance C2 of the band limiting capacitor and an impedance of the collector of the transistor Tr102. The band limiting capacitor is connected between (i) the collector of the transistor Tr102, i.e., output node of the amplifier circuit A12, and (ii) a grounded point, i.e., GND, where the emitter is grounded. This allows the capacitor C2 to sufficiently reduce the cutoff frequency of the dummy amplifier 3, thereby sufficiently realizing band limiting and noise reduction in the dummy amplifier 3. Further, the stabilization time t at the time of switching a feedback resistor Rf is sufficiently small and determined based on (i) a capacitance of the capacitor C2, (ii) a voltage variation ΔVc of the collector of the transistor Tr102 at the time of switching a feedback resistor Rf, and (iii) a current Ica to be flowed into the collector.

In such a manner, a light receiving amplifier circuit is realized which is capable of shortening the stabilization time while having a band limiting capacitor.

Further, it is desirable that a capacitance of the capacitor C2 be the one sufficient to reduce a gain of the dummy amplifier 3 in a reproducing signal band of the optical disk 102. This allows reduction of the noise in the reproducing signal band caused by the optical disk 102 and inserted into the dummy amplifier 3.

Further, the dummy amplifier 3 has a noise which mainly includes a thermal noise of a resistance Rf (VN=(4×k×Rf×T) 1/2). Since the band limiting suppresses the noise, a signal/noise ratio (SN ratio) is improved.

Based on [Equation 8] expressing the time constant CR(C2), the cutoff frequency fc(C2), determined by the capacitance C2 and the impedance r of the collector of the transistor Tr102, is obtained by the following equation 13:

$$fc(C2)=1/(2 \times \pi \times C2 \times (VA/(Ica/2))) \quad \text{[Equation 13]}.$$

When fc(C2)<f (optical disk reproducing signal frequency), the noise at the reproducing signal frequency is reduced by the capacitor C2. Thus, when the following equation 14 is satisfied, the cutoff frequency fc(C2) becomes lower than the reproducing signal frequency f. This allows reduction in the noise which may be inserted into the dummy amplifier 3 at the reproducing signal frequency f.

$$C2>1/(2 \times \pi \times (VA/(Ica/2)) \times f) \quad \text{[Equation 14]}.$$

Further, the cutoff frequency fc(C2) varies depending on Ica as seen from [Equation 13], while the stabilization time t does not vary depending on Ica as seen from [Equation 12]. Thus, by switching a value of Ica according to a feedback resistance (gain), it is possible to switch the time constant CR(C2) without changing the stabilization time t. Here, a thermal noise generated by a feedback resistor having a resistance Rf is expressed by $$(4k \cdot Rf \cdot T)1/2,$$

where k is a Boltzmann constant and T is an absolute temperature. The larger Rf is, the greater the noise becomes. Considering this, for a larger value of Rf, Ica is reduced and thereby the time constant is increased. That is, reduction in noise at high frequencies is realized by reducing the cutoff frequency. ri=((1+hFE)×VA/Icb) is ignored in calculation of [Equation 7]. However, when ri is taken into account, r and CR(C2) are expressed by the following equations 15 and 16:e found, $$r=1/((2 \times Ica/VA)+(1/((1+hFE) \times VA/Icb))) \quad \text{[Equation 15]};$$

and $$CR(C2)=C2/((2 \times Ica/VA)+(1/((1+hFE) \times VA/Icb))) \quad \text{[Equation 16]}.$$

This allows switching of the time constant CR(C2) without changing the stabilization time t, when the Icb is switched to a different value in accordance with switching of a feedback resistor Rf. Due to the same reason mentioned above, for a larger value of Rf, Icb is reduced and thereby the time constant is increased. That is, reduction in noise at high frequencies is realized by reducing the cutoff frequency.

In the light receiving amplifier circuit 1, NPN transistors are used for inputting-use transistors Tr101 and Tr102 of the IV amplifier 2 and the dummy amplifier 3, by grounding their emitters. However, the present embodiment is not limited to this and transistors of PNP type may be also used as inputting-use transistors. In this case, an amplifier circuit serves as an grounded-emitter amplifier circuit which extracts an output from its collector by connecting its emitter to the power source Vcc. Further, a band limiting capacitor serving as the capacitor C2 is connected between the collector and the emitter (power source Vcc) of the transistor. Thus, regardless of whether an inputting-use transistor is an NPN transistor or a PNP transistor, a band limiting capacitor is connected between the collector of the transistor and a grounded point where the emitter is grounded (i.e., alternating grounded point). Similarly, the output circuits B11 and B12 may be emitter follower circuits employing the PNP transistors Tr111 and Tr112.

Further, an optical pickup device 101 having the light receiving amplifier circuit 1 (see FIG. 4) is capable of shortening the stabilization time while having a band limiting capacitor. This gives an advantage of realizing a high-speed response when received light of a light receiving element PD1 needs to be amplified while a feedback resistor Rf is switched. Such an advantage is effective, for example, when the optical disk 102 is read while being written.

Second Embodiment

Figure 2:
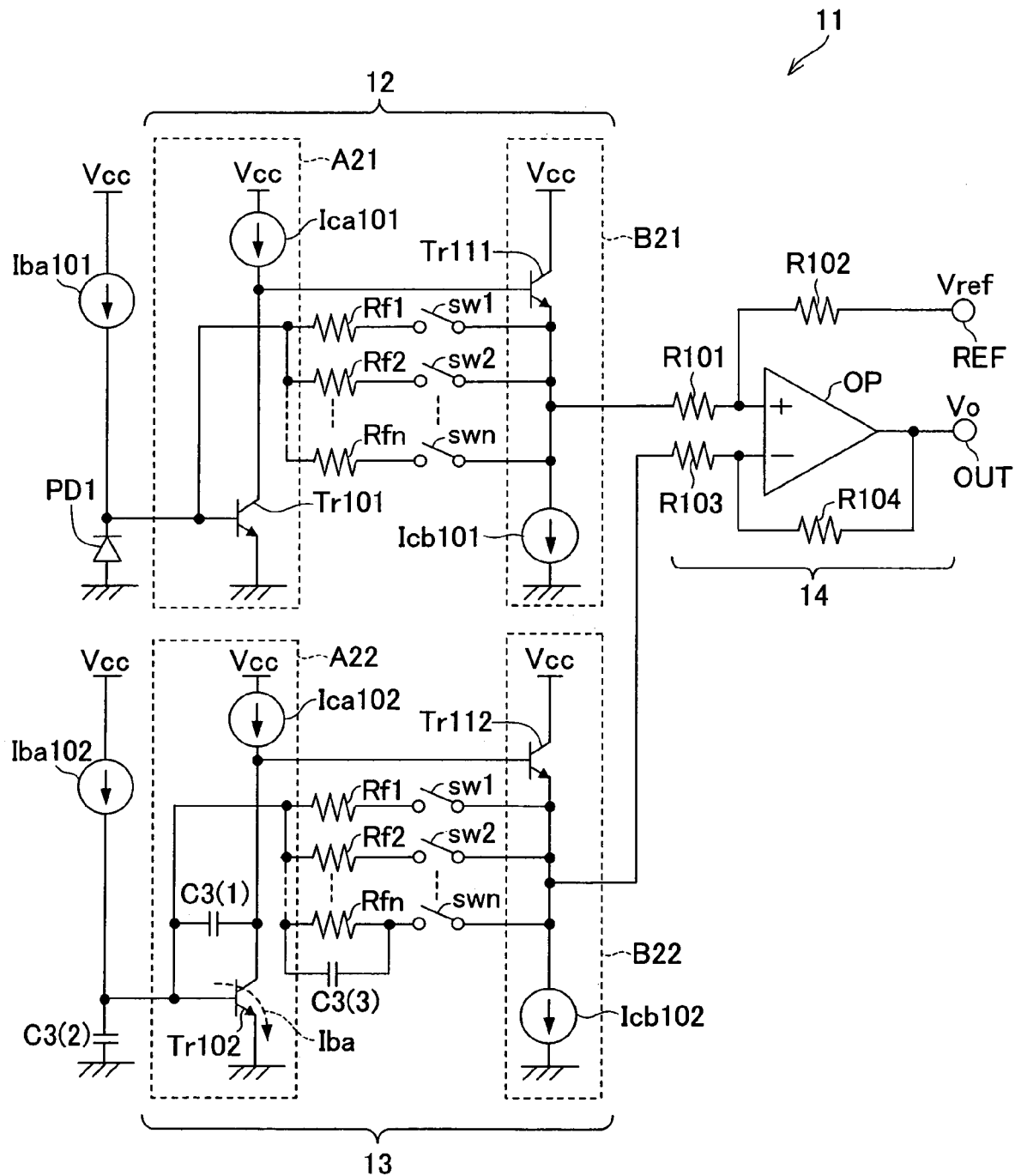
FIG. 2 is a circuit diagram illustrating a circuitry of a light receiving amplifier circuit according to a second embodiment of the present invention.
Figure 3:
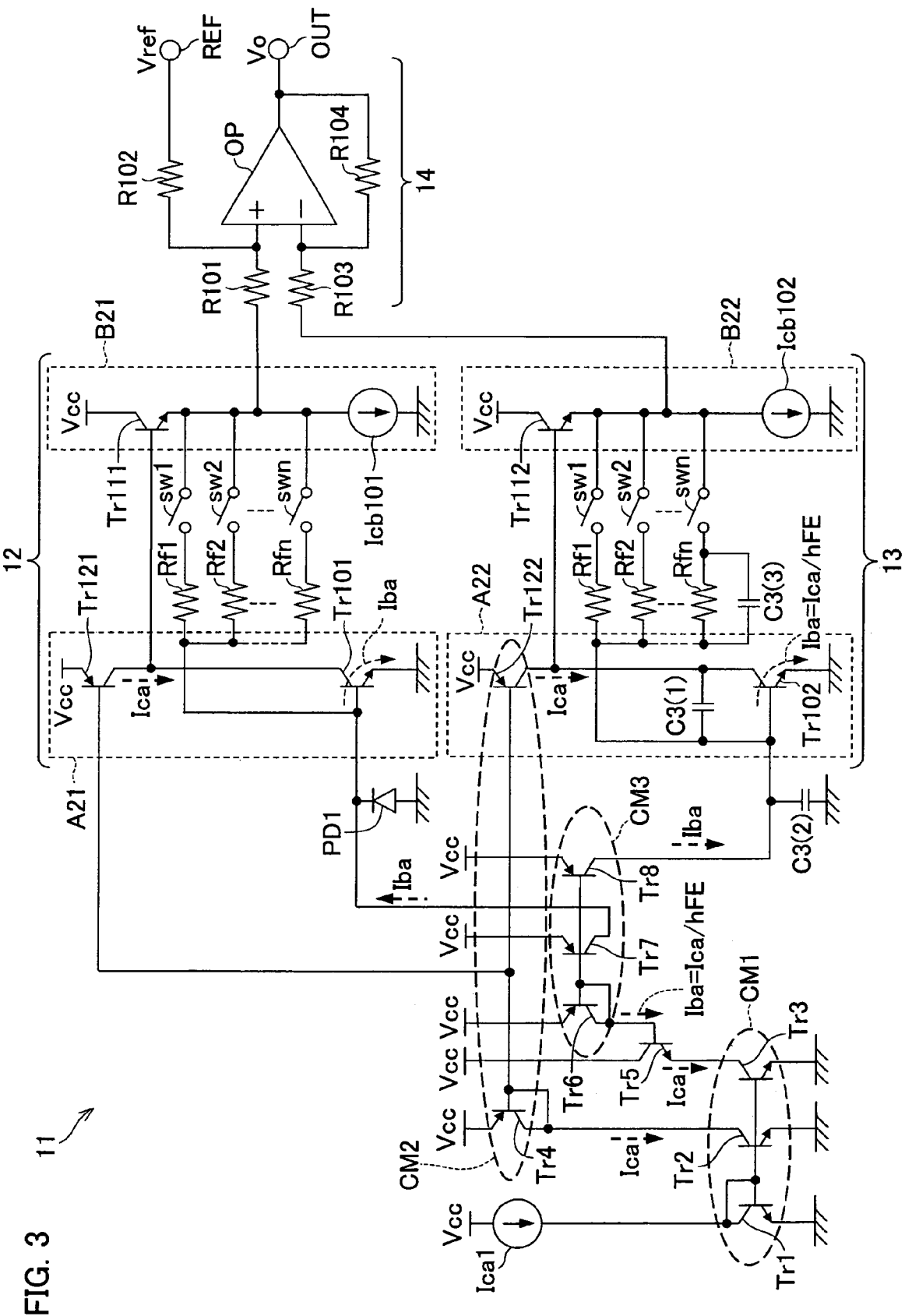
FIG. 3 is a circuit diagram explicitly illustrating a specific circuitry of a portion of a constant current source provided in the light receiving amplifier circuit illustrated in FIG. 2.

With reference to FIGS. 2 through 4, another embodiment of the present invention is described below.

FIG. 2 illustrates a circuitry of a light receiving amplifier circuit 11 of the present embodiment. The light receiving amplifier circuit 11 can be provided in the light receiving amplifier elements 109, 110, and 111 of the optical pickup device 101 shown in FIG. 4.

The light receiving amplifier circuit 11 includes a photodiode PD1, an IV amplifier 12, a dummy amplifier 13, and a differential amplifier circuit 14.

The photodiode (light receiving element) PD1 has an anode connected to GND, and a cathode connected to a base of a transistor Tr101.

The IV amplifier 12 includes a constant current source Iba101, an amplifier circuit A21, an output circuit B21, and a plurality of feedback resistors Rf1, Rf2, . . . Rfn. The amplifier circuit A21 is constituted by an grounded-emitter amplifier circuit, and the output circuit B21 is constituted by an emitter follower circuit. Further, the IV amplifier 12 converts a current generated by the photodiode PD1 into a voltage and outputs the voltage thus converted.

The constant current source Iba101 is connected between a power source Vcc and the base of the transistor Tr101, and causes constant current to flow from the power source Vcc to the base of the transistor Tr101.

The amplifier circuit A21 includes the transistor Tr101 and a constant current source Ica101. The transistor (grounded-emitter transistor) Tr101 is a transistor of NPN type, and has the base connected to the cathode of the photodiode PD1. Further, the transistor Tr101 has an emitter connected to the GND and a collector connected to the constant current source Ica101 serving as an active load. An input signal is supplied via the base of the transistor Tr101 in the amplifier circuit A21, i.e., the base serves as an input terminal of the IV amplifier 12. An output signal is outputted via the collector (output node) of the transistor Tr101 in the amplifier circuit A21.

The output circuit B21 includes a transistor Tr111 and a constant current source Icb101. The transistor Tr111 is a transistor of NPN type, and has a base connected to the collector of the transistor Tr101, a collector connected to the power source Vcc, and an emitter connected to the constant current source Icb101 serving as an active load. As such, in the IV amplifier 12, the output terminal obtains an output voltage which varies depending on an output signal from the output node of the amplifier circuit A21.

In FIG. 2, basically, an output of the IV amplifier is not affected by a subsequent load. Rather, such an output signal is determined according to (i) a voltage VBE of the grounded-emitter Tr and (ii) (a base current of the grounded-emitter Tr)×(the feedback resistor Rf).

Base currents of the transistors Tr101, Tr111, Tr102 and Tr112 are correspondingly determined by the constant current sources Ica101, Icb101, Ica102 and Icb102 (each base current becomes 1/hFE of the value of its corresponding constant current source), respectively.

Output terminal voltages of the IV amplifier, i.e., emitter voltages of Tr111 and Tr112, are given as follows.

An output voltage during no light emission is found.

$$IB(Tr101)=(Ica101-IB(Tr111)/hFE(Tr101)=Ica101/hFE(Tr101)$$ [Equation A1].

By using the [Equation A1], an output voltage of the IV amplifier 12 during no light emission is found by the following equation A2:

An output voltage of the IV amplifier 12 during no light emission=$VBE(Tr101)+(IB(Tr101)\times Rf)$=
$VBE(Tr101)+(Ica101/hFE(Tr101)\times Rf)$ [Equation A2], where VBE denotes a voltage between the base and the emitter, IB denotes a base current, and hFE denotes a current amplification factor of the transistor. Further, the following relationship is satisfied:

$$Ica101>>IB(Tr111).$$

Similarly, an output voltage of the dummy amplifier 13 during no light emission is found as follows, An output voltage of the IV amplifier 13 during no light emission=$VBE(Tr102)+(IB(Tr102)\times Rf)$=
$VBE(Tr102)+(Ica102/hFE(Tr102)\times Rf)$ [Equation A3].

Basically, [Equation A2] is equal to [Equation A3].

An output voltage during receiving light is found by the following equation A4:

An output voltage of the IV amplifier 12 during receiving light=[an output voltage during no light emission]+$[IPD\times Rf]$ [Equation A4], where IPD denotes a photocurrent during receiving light.

In the IV amplifier 12, in order to feed back the emitter potential to its input terminal, the feedback resistors Rf1, Rf2, . . . Rfn are mutually connected in parallel between the output terminal and the base of the transistor Tr101 of the amplifier circuit A11. Thus, feedback paths are provided between the output terminal and the base of the transistor Tr101. Further, in the feedback paths, switches sw1, sw2, . . . swn are inserted and connected in series with the feedback resistors Rf1, Rf2, . . . Rfn, respectively. With the switches, the feedback resistors Rf1, Rf2, . . . Rfn are switched so that either one of the resistors is used. This allows switching of a gain of the light receiving amplifier circuit 11. Such switching operation is done according to (i) whether an optical disk 102 is read out or written or (ii) a variation in inputted light to the light receiving amplifier circuit 11 according to a type of the optical disk 102 (e.g. DVD-R, DVD-RW, DVD-RAM, etc.). This causes the feedback resistor(s) Rf to be selected, thereby switching the gain of the light receiving amplifier circuit 121.

The dummy amplifier 13 has the same structure as the IV amplifier 12 except that the dummy amplifier 13 has no connection with a light receiving element and contains a capacitor C3 explained later. The dummy amplifier 13 includes an amplifier circuit A22 and an output circuit B22, which correspond to the amplifier circuit A21 and the output circuit B21, respectively. Further, the dummy amplifier 13 includes feedback resistors Rf1, Rf2, . . . Rfn, which are the same as those provided in the IV amplifier 12. The amplifier circuit A22 and the output circuit B22 include the transistors Tr102 and Tr112, respectively, which correspond to the transistors Tr101 and Tr111, respectively. Further, the amplifier circuit A22 and the output circuit B22 include the constant current sources Ica102 and Icb102, respectively, which correspond to the constant current sources Ica101 and Icb101, respectively.

The constant current source Iba101 and the constant current source Iba102 output the same current, i.e., Iba. The transistors Tr101 and Tr102 have the same electric characteristics, while the transistors Tr111 and Tr112 have the same electric characteristics. Further, the constant current sources Ica101 and Ica102 output the same current, i.e., Ica, while the constant current sources Icb101 and Icb102 output the same current, i.e., Icb.

The dummy amplifier 13 only outputs and supplies a reference voltage to the following differential amplifier circuit 14. Therefore, the dummy amplifier 13 does not need to amplify the inputted light, requiring no connection with a light receiving element. Since the dummy amplifier 13 has substantially the same structure as the IV amplifier 12 as noted above, the dummy amplifier 13 outputs a reference voltage equal to an output voltage of the IV amplifier 12 during no light emission. As such, the dummy amplifier 13 contributes to an improvement in the characteristics of the output voltage of the light receiving amplifier circuit 11 during no light emission (offset voltage).

The differential amplifier circuit 14 receives an output voltage of the IV amplifier 12 and an output voltage of the dummy amplifier 13, and amplifies a difference therebetween. The differential amplifier circuit 14 includes an operational amplifier OP and resistors R101 through R104. The resistor R101 is connected between the output terminal of the IV amplifier 12 and a non-inverting input terminal of the operational amplifier OP. The resistor R102 is connected between a terminal REF and the non-inverting input terminal of the operational amplifier OP. An external reference voltage Vref is supplied via the terminal REF. The resistor R103 is connected between an output terminal of the dummy amplifier 13 and an inverting input terminal of the operational amplifier OP. The resistor 104 is connected between a terminal OUT and the inverting input terminal of the operational amplifier OP. An output voltage Vo of the differential amplifier circuit 14 is outputted via the terminal OUT.

In the differential amplifier circuit 14, the following relationship is satisfied:

$$Vo = Vref + (R2/R1) \times (V1 - V2),$$

where V1 denotes an output voltage of the IV amplifier 12, V2 denotes an output voltage of the dummy amplifier 13, R1 is a resistance of the resistors R101 and R103, and R2 is a resistance of the resistors R102 and R104.

Described next is operation of the light receiving amplifier circuit 11 having the above structure.

Figure 5:
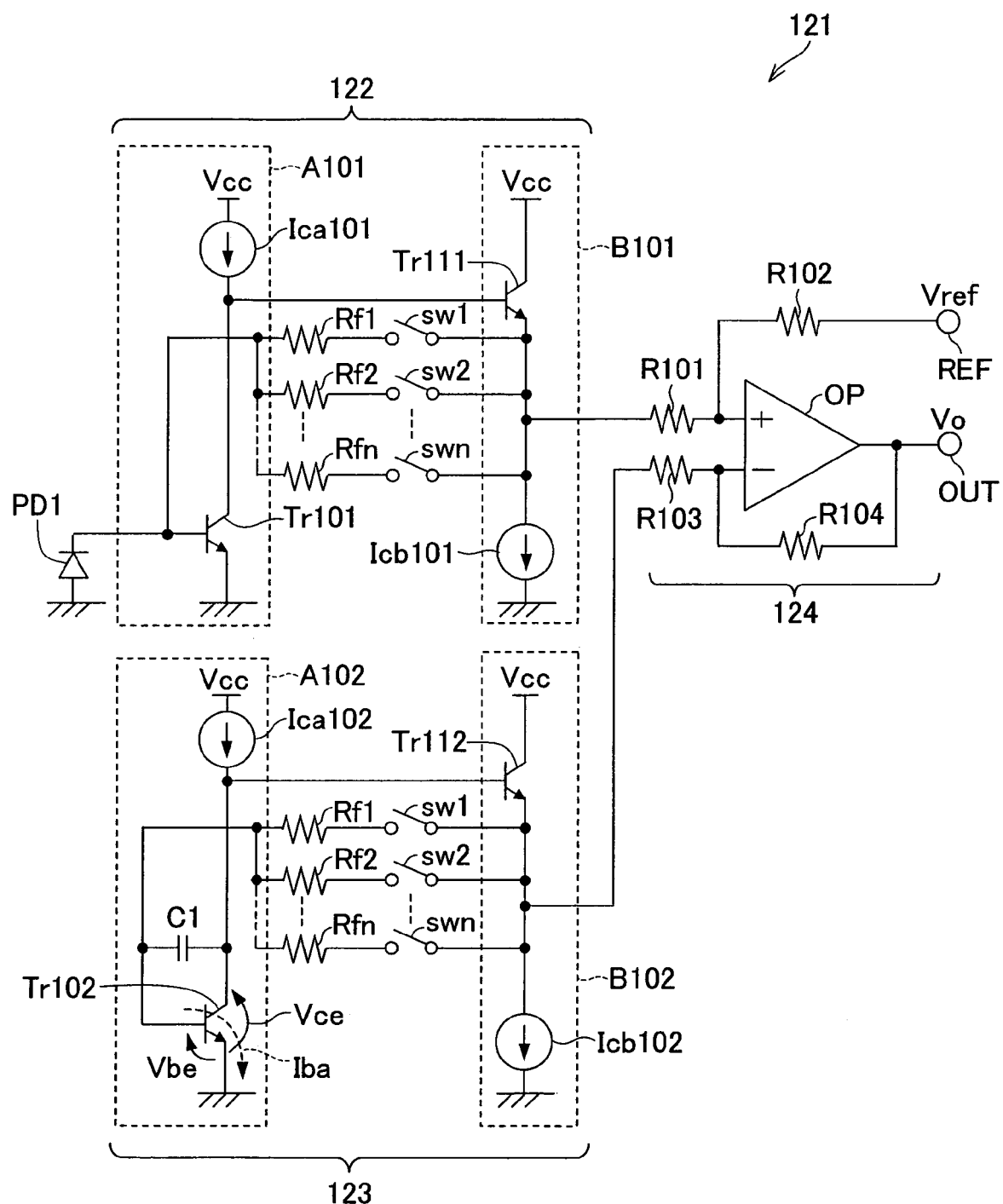
FIG. 5 is a circuit diagram illustrating a circuitry of a conventional light receiving amplifier circuit.
Figure 6:
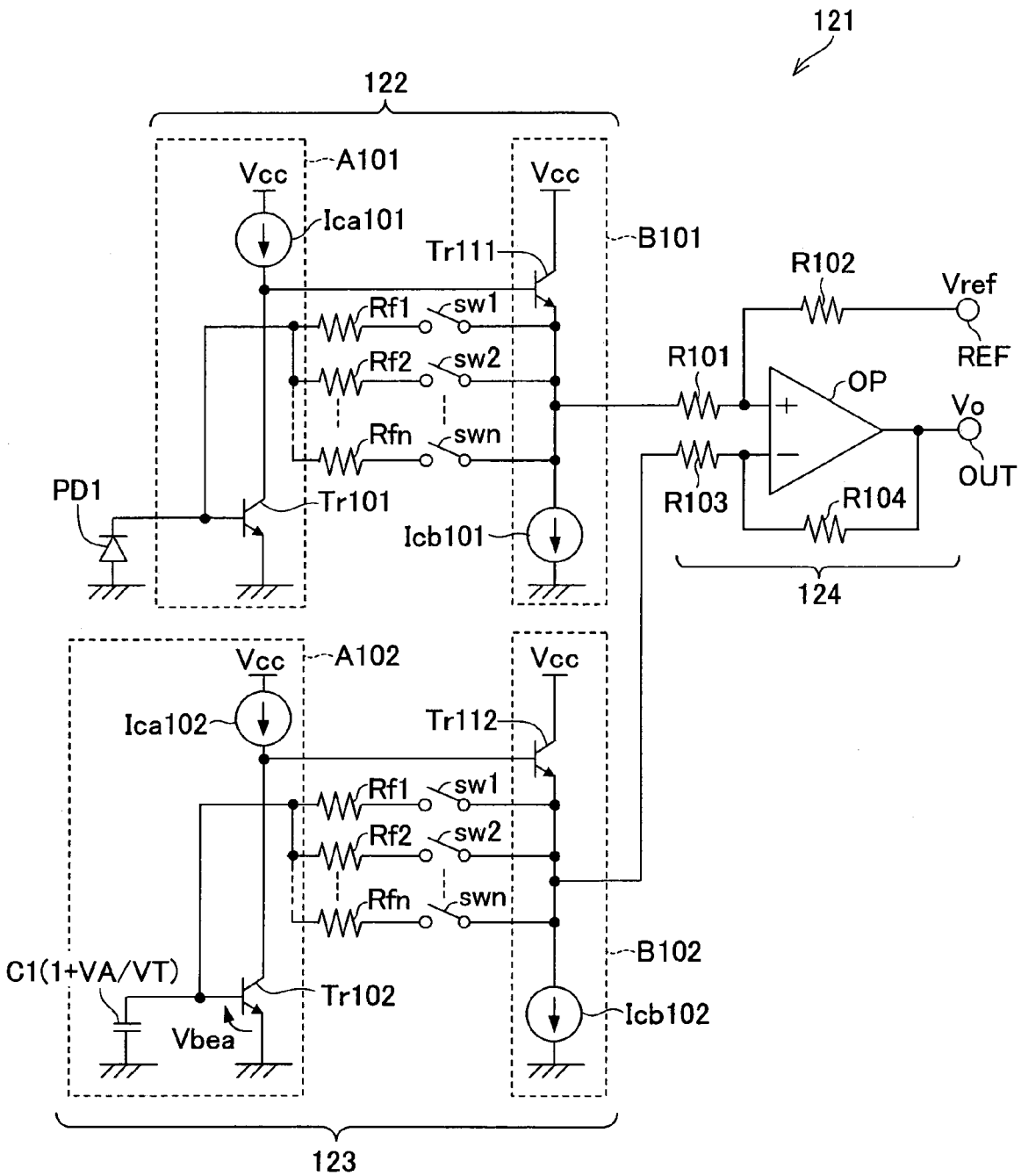
FIG. 6 is a circuit diagram illustrating a circuitry of an equivalent circuit of the light receiving amplifier circuit illustrated in FIG. 5.

In the light receiving amplifier circuit 121 shown in FIG. 5 as a conventional light receiving amplifier circuit, a current flowing through a feedback resistor Rf, employed in the IV amplifier 122, is separated into a current of the photodiode PD1 and a base current of the transistor Tr101. Further, any current flowing through a feedback resistor Rf employed in the dummy amplifier 123 becomes a base current of the transistor Tr102. The base current of the transistor Tr102 is equal to the base current, i.e., bias current, of the transistor Tr101 during no light emission from the photodiode PD1. Considering this, in the present embodiment, the dummy amplifier 123 is arranged such that the bias current of the transistor Tr102 is supplied by the constant current source Iba102 and no current flows through the feedback resistor Rf. As noted above, the amount of the bias current is Iba.

In FIG. 5, the stabilization time t is expressed by [Equation 3]:

$$t = C1 \times Rf2 \times (1 + (VA/VT)) \times \ln(1/(1 - (\Delta Vc/\Delta Vbe))) \quad \text{[Equation 3]}.$$

However, when the voltage variation ΔVbe at the time of switching a feedback resistance (gain) is 0, ΔVc is inevitably 0, with the result that the stabilization time becomes 0.

On the other hand, in FIG. 5, when Vbe1 is the voltage between the base and the emitter of the transistor Tr102 when Rf1 is used as the feedback resistor and Vbe2 is the voltage between the base and the emitter of the transistor Tr102 when Rf2 is used as the feedback resistor, Vbe1 and Vbe2 are expressed by the following equations:

$$Vbe1 = VT \times \ln(Ica/(Is \times (1 + (Vce1/VA)))) \quad \text{[Equation 17]},$$

and $$Vbe2 = VT \times \ln(Ica/(Is \times (1 + (Vce2/VA)))) \quad \text{[Equation 18]},$$

where Is is a reverse saturation current between the base and the emitter of the transistor Tr102, Vce1 is a voltage between the collector and the emitter of the transistor Tr102 when Rf1 is used as the feedback resistor, and Vce2 is the voltage between the collector and the emitter of the transistor Tr102 when Rf2 is used as the feedback resistor.

Thus, when the feedback resistor is switched from Rf1 to Rf2, ΔVbe is expressed by the following equation 19:

$$\Delta vbe = Vbe2 - Vbe1 = VT \times \ln((VA + Vce2)/(VA + Vce1)) \quad \text{[Equation 19]}.$$

According to [Equation 19], when Vce1=Vce2, ΔVbe becomes 0.

Further, in FIG. 5, Vce1 and Vce2 are expressed by the following equations 20 and 21:

$$Vce1 = Vbe1 + (Rf1 \times Iba) + Vbeb \quad \text{[Equation 20]},$$

and $$Vce2 = Vbe2 + (Rf2 \times Iba) + Vbeb \quad \text{[Equation 21]},$$

where Vbeb is a voltage between the base and the emitter of the transistor Tr112 and does not vary regardless of whether the voltage between the base and the emitter of the transistor Tr102 is Vbe1 or Vbe2. Further, a current flowing through the feedback resistor Rf1 and a current flowing through the feedback resistor Rf2 are mutually equal, i.e., Iba. Therefore, substituting the equation 19 into the following equation 22:

$$Vce2 - Vce1 = (Vbe2 - Vbe1) + (Rf2 \times Iba - Rf1 \times Iba) \quad \text{[Equation 22]}$$

yields the following equation 23:

$$Vce2 - Vce1 = VT \times \ln((VA + Vce2)/(VA + Vce1)) + (Rf2 \times Iba - Rf1 \times Iba) \quad \text{[Equation 23]},$$

where the first term indicates a variation in Vbe and becomes 0 when Ica and Vce are constant, i.e., Ica=Vce, according to [Equation 17]. The second term indicates a variation in a voltage determined by the product of a feedback resistance Rf and a current Iba, i.e., an input current of the grounded-emitter amplifier circuit. The variation in the voltage becomes zero by avoiding the current Iba from flowing into the feedback resistor Rf. That is, the current flowing into the feedback resistor Rf becomes 0 when a bias current, i.e., the current Iba, is supplied to the base of the transistor Tr102 by using the constant current source Iba102 as shown in FIG. 2. This allows [Equation 23] to be 0, further enabling to realize 0 for the stabilization time t. In this manner, by setting the current flowing into the feedback resistor Rf to 0, the base current of the transistor Tr102 is fixed to the output current of the constant current source Iba102. This allows the current between the base and the emitter of the transistor Tr102 to be always constant. In addition, no voltage drop occurs in the feedback resistor Rf, and the voltage Vbeb between the base and the emitter of the transistor Tr112 is always constant. Thus, the voltage Vce between the collector and the emitter of the transistor Tr102 always becomes constant and expressed by the sum of the following:

[the voltage between the base and the emitter of the transistor Tr102]+[the voltage between the base and the emitter of the transistor Tr112].

The foregoing can be also understood from the following theory: An output voltage of the dummy amplifier 13 is always equal to a constant voltage between the base and the emitter of the transistor Tr102, so that no change occurs in voltage distribution and current distribution of the dummy amplifier 13 and the collector potential of the transistor Tr102 becomes constant, even by switching the feedback resistor Rf.

By setting the current flowing into the feedback resistor Rf to 0, switching a gain does not cause voltage variation in the input and the output of the grounded-emitter amplifier circuit (base terminal and collector terminal of the transistor Tr102, respectively) or the output of the dummy amplifier 13. Therefore, even when a band limiting capacitor, i.e., a capacitor C3, is connected to any positions indicated above, no charging and discharging currents occur and the band is limited, while the stabilization time remains 0. That is, as indicated by C3(1) in FIG. 2, the capacitor C3 may be connected between the base and the collector of the transistor Tr102. Alternatively, the capacitor C3 may be connected between the base of the transistor Tr102 and the GND as indicated by C3(2) in FIG. 2, or may be connected in parallel to the feedback resistor Rf as indicated by C3(3) in FIG. 2. When capacitors C3 are connected in parallel to the respective feedback resistors Rf, the capacitors C3 are not charged because no current flows through the feedback resistors Rf, and no voltage occurs in the capacitors C3, regardless of connection or disconnection to the feedback resistor Rf. This allows the band to be limited while the stabilization time remains 0.

Further, it is desirable that the capacitor C3 have a capacitance sufficient to reduce the gain of the dummy amplifier 13 in the reproducing signal band of the optical disk 102. This allows reduction of the noise in the reproducing signal band caused by the optical disk 102 inserted into the dummy amplifier 13.

Further, the reference voltage supplying amplifier has a noise which mainly includes a thermal noise from a gain resistor Rf(VN=(4×k×Rf×T)1/2). Since the band limiting suppresses such noise, the signal/noise ratio (SN ratio) is improved.

Further, in the light receiving amplifier circuit 11, when the capacitor C3 is connected as indicated by C3(1), the time constant CR(C3) is expressed by the following equation 22:

$$CR(C3)=Rf \times C3 \qquad \text{[Equation 22]},$$

which is similar to Equation 1.

When the capacitor C3 is connected as indicated by C3(3), the time constant CR(C3) is also expressed similarly and the cutoff frequency fc(C3) is found by the following equation 23:

$$fc(C3)=1/(2 \times \pi \times C3 \times Rf) \qquad \text{[Equation 23]}.$$

Thus, the capacitor C3 reduces the noise at the reproducing signal frequency when the following relationship is satisfied, $$fc(C3) < f(\text{optical disk reproducing signal frequency}).$$

Accordingly, the following relationship is established, $$C3 > 1/(2 \times \pi \times Rf \times f) \qquad \text{[Equation 24]}.$$

When the capacitor C3 is connected as indicated by C3(2), due to the mirror effect, the same effect as in the case of C3(1) can be obtained by connecting the capacitor having a capacitance of (1+hFE) times as large as that of the capacitor C3 connected as indicated by C3(1). That is, the capacitor C3 reduces the noise at the reproducing signal frequency when the following relationship is satisfied, $$C3 > (1+hFE)/(2 \times \pi \times Rf \times f) \qquad \text{[Equation 25]}.$$

With reference to FIG. 3, the following exemplifies a structure of the constant current sources Iba101 and Iba102 shown in FIG. 2.

In FIG. 3, in order to constitute the constant current sources Iba101 and Iba102 and the constant current sources Ica101 and Ica102, the light receiving amplifier circuit 11 includes a reference constant current source Ica1, current mirror circuits CM1, CM2 and CM3, and a transistor Tr5.

The reference constant current source Ica 1 is provided between the power source Vcc and a collector of a transistor Tr1 explained later. The current mirror circuit (first current mirror circuit) CM1 is realized by three NPN transistors Tr1, Tr2 and Tr3, which respectively have bases connected to one another and emitters connected to the GND. A collector of the transistor Tr 1 is connected to its base and receives a constant current from the reference constant current source Ica1.

The current mirror circuit (second current mirror circuit) CM2 is realized by three PNP transistors Tr4, Tr121 and Tr122, which respectively have bases connected to one another and emitters connected to the power source Vcc. A collector of the transistor Tr4 is connected to its base and a collector of the transistor Tr2. A collector of the transistor Tr121 is connected to the collector of the transistor Tr101, and a collector of the transistor Tr122 is connected to the collector of the Tr102.

The transistor (bias current generating transistor) Tr5 is a transistor of NPN type. The transistor Tr5 has an emitter connected to a collector of the transistor Tr3 of the current mirror circuit CM1, and a collector connected to the power source Vcc. Further, a base of the transistor Tr5 is connected to the current mirror circuit CM3 explained later. The transistor Tr5 converts a current so as to generate a bias current, i.e., base current, of the transistors Tr101 and Tr102.

The current mirror circuit (third current mirror circuit) CM3 is realized by three PNP transistors Tr6, Tr7 and Tr8, which respectively have bases connected to one another and emitters connected to the power source Vcc. A collector of the transistor Tr6 is connected to its base and the base of the transistor Tr5. A collector of the transistor Tr7 is connected to the base of the transistor Tr101. A collector of the transistor Tr8 is connected to the base of the transistor Tr102.

In the light receiving amplifier circuit 11 shown in FIG. 3, the reference constant current source Ica1 outputs a constant current, i.e., a current Ica. The current Ica is conducted by the current mirror circuit CM1 from the transistor Tr1 to the transistors Tr2 and Tr3. The current Ica supplied to the transistor Tr3 is further conducted by the current mirror circuit CM2 from the transistor Tr4 to the transistors Tr121 and Tr122. In this way, the current Ica for the constant current sources Ica101 and Ica102 shown in FIG. 2 is generated. As such, the constant current source Ica101 shown in FIG. 2 is constituted by the reference constant current source Ica1, the current mirror circuit CM1, the current mirror circuit CM2, and the transistor Tr121, which are shown in FIG. 3, while the constant current source Ica102 shown in FIG. 2 is constituted by the reference constant current source Ica1, the current mirror circuit CM1, the current mirror circuit CM2, and the transistor Tr122, which are shown in FIG. 3.

Since the current Ica conducted to the transistor Tr3 by the current mirror circuit CM1 becomes a collector current of the transistor Tr5, the transistor Tr5 conducts a base current of Ica/hFE (hFE is a direct current amplification factor of the transistor Tr5). Further, in order for the base current to be a collector current of the transistor Tr7, the current is conducted by the current mirror circuit CM3 from the transistor Tr6 to the transistors Tr7 and Tr8. The current conducted to the transistor Tr7 is supplied to the base of the transistor Tr101, while the current conducted to the transistor Tr8 is supplied to the base of the transistor Tr102. The direct current amplification factor hFE of the transistor Tr5 is set to be equal to a direct current amplification factor hFE of the transistor Tr101. Further, the current supplied from the transistor Tr7 to the transistor Tr101 and the current supplied from the transistor Tr8 to the transistor Tr102 respectively become the bias currents explained with reference to FIG. 2.

As such, the reference constant current source Ica 1, the current mirror circuit CM1, and the current mirror circuit CM3, which are shown in FIG. 3, constitute the constant current sources Iba101 and Iba102, which are shown in FIG. 2.

In FIG. 3, an output current of the reference constant current source Ica 1 is supplied via the current mirror circuits CM1 and CM2 to the respective output nodes of the amplifier circuits A21 and A22. The output current serves as currents outputted by the active loads of the transistors Tr101 and Tr102, which are provided in the IV amplifier 12 and the dummy amplifier 13, respectively. Further, an output current of the reference constant current source Ica1 is supplied via the current mirror circuits CM1 and CM3 to the transistors Tr101 and Tr102. The output current serves as bias currents outputted by the constant current sources Iba101 and Iba102, which are provided in the IV amplifier 12 and the dummy amplifier 13, respectively. As such, two constant current sources, which are respectively provided in the IV amplifier 12 and dummy amplifier 13, are realized in a simple circuit employing a common reference constant current source.

In the light receiving amplifier circuit 11, NPN transistors are used for the respective inputting-use transistors Tr101 and Tr102 of the amplifier 12 and the dummy amplifier 13, by grounding their emitters. However, the present embodiment is not limited to this and transistors of PNP type may be used for the inputting-use transistors. In this case, an amplifier circuit is a grounded-emitter amplifier circuit which extracts an output from its collector by connecting its emitter to the power source Vcc. Further, a band limiting capacitor corresponding to the capacitor C3 is connected between the base and the collector of the transistor in the case of C3(1). Alternatively, in the case of C3(2), the capacitor C3 is connected between the base of the transistor and the power source Vcc (i.e., grounded point where the emitter is grounded (alternating grounded point)). In the case of C3(3), the capacitor C3 is connected in parallel to the feedback resistor Rf. Similarly, the output circuits B11 and B12 may be emitter follower circuits employing the PNP transistors Tr111 and Tr112.

Further, the optical pickup device 101 having the light receiving amplifier circuit 11 (see FIG. 4) allows reduction in the stabilization time while having a band limiting capacitor. This gives an advantage of realizing a high speed response when received light of the light receiving element PD1 needs to be amplified while a feedback resistor Rf is switched. Such an advantage is effective, for example, when the optical disk 102 is read out while being written.

Further, in the light receiving amplifier circuit of the present embodiment, each of the current-to-voltage conversion circuit and the reference voltage supplying amplifier may be arranged so as to include: a reference constant current source which outputs a constant current equal to a collector current corresponding to the bias current of the grounded-emitter transistor; a first current mirror circuit which conducts the constant current of the reference constant current source; a second current mirror circuit which conducts the current outputted from the first current mirror circuit; a bias current generating transistor which generates a base current equal to the bias current by using, as a collector current, the current outputted by the first current mirror circuit; and a third current mirror circuit which conducts the base current generated by the bias current generating transistor, a current outputted from the second current mirror circuit is a current outputted from an active load of the grounded-emitter transistor, and a current outputted from the third current mirror circuit is the bias current outputted from the bias-use constant current source.

As such, two constant current sources, which are respectively provided in the current-to-voltage conversion circuit and reference voltage supplying amplifier, are realized in a simple circuit employing a common constant current source.

Further, in the light receiving amplifier circuit of the present embodiment, the received light of the light receiving element may serve as reproducing signal light of an optical disk, and the band limiting capacitor may have a capacitance allowing reduction in gain of the reference voltage supplying amplifier in a reproducing signal band of the optical disk.

According to the arrangement, even when a noise in the reproducing signal band from the optical disk is inserted into the reference voltage supplying amplifier, the noise can be attenuated.

Further, the dummy amplifier has a noise which mainly includes a thermal noise of the gain resistor Rf(VN=(4×k× Rf×T)1/2). Since the band limiting suppresses the noise, the signal/noise ratio (SN ratio) is improved.

Further, the light receiving amplifier of the present embodiment may be arranged such that the received light of the light receiving element serves as reproducing signal light of an optical disk, and the band limiting capacitor has a capacitance C expressed by the following inequality:

$C > 1/(2 \times \pi \times r \times f)$, where r is an impedance at the output node of the grounded-emitter amplifier circuit and f is a reproducing signal frequency of the optical disk.

According to the arrangement, a cutoff frequency determined by the band limiting capacitance and the impedance of the output node is lower than the reproducing signal frequency of the optical disk. Thus, even when a noise at the reproducing signal frequency of the optical disk is supplied to the reference voltage supplying amplifier, the noise can be reduced.

Further, in the light receiving amplifier of the present embodiment, the grounded-emitter amplifier circuit may have a constant current source serving as an active load of the grounded-emitter transistor, and the constant current source of the grounded-emitter amplifier circuit may have a current to be switched according to a resistance of the feedback resistor in use.

According to the arrangement, the impedance at the output node of the grounded-emitter amplifier circuit varies depending on the current of a constant current source. Since the cutoff frequency is determined by the band limiting capacitance and the impedance at the output node, the cutoff frequency varies depending on the current of the constant current source. On the other hand, the stabilization time does not vary depending on the current of the constant current source. Thus, by varying the current of the constant current source according to the resistance of the feedback resistor, the time constant is switched without changing the stabilization time.

Further, in the light receiving amplifier of the present embodiment, the current of the constant current source of the grounded-emitter amplifier circuit may be switched so as to decrease for increase of the resistance of the feedback resistor.

According to the arrangement, the thermal noise generated by the feedback resistor is greater as the resistance of the feedback resistor is higher. However, the current of the constant current source is switched so as to decrease for increase of the resistance of the feedback resistor in use. Thus, by increasing the time constant and reducing the cutoff frequency, it is possible to reduce a noise at high frequencies caused due to the thermal noise.

Further, in the light receiving amplifier of the present embodiment, each of the current-to-voltage conversion circuit and the reference voltage supplying amplifier further includes an emitter follower circuit receiving, as an input, an output from the output node of the grounded-emitter amplifier circuit, the emitter follower circuit including a transistor and a constant current source serving as an active load of the transistor, and the constant current source having a current to be switched according to a resistance of the feedback resistor in use.

According to the arrangement, the current of the constant current source of the emitter follower circuit is switched according to the resistance of the feedback resistor in use. This enables switching of the time constant without changing the stabilization time.

Further, in the light receiving amplifier of the present embodiment, the current of the constant current source of the emitter follower circuit may be switched so as to decrease for increase of the resistance of the feedback resistor.

According to the arrangement, the current of the constant current source of the emitter follower circuit is switched so as to decrease for increase of the resistance of the feedback resistor. This increases the time constant and thereby reduces the cutoff frequency, allowing reduction in noise at high frequencies.

Further, in the light receiving amplifier of the present embodiment, the received light of the light receiving element may serve as reproducing signal light of an optical disk, and the band limiting capacitor may have a capacitance C expressed by the following inequality:

$$C > 1/(2 \times \pi \times Rf \times f),$$

where Rf is a resistance of the feedback resistor in use and f is a reproducing signal frequency of the optical disk.

According to the arrangement, it is possible to reduce the noise at the reproducing signal frequency.

Further, in the light receiving amplifier of the present embodiment, the received light of the light receiving element may serve as reproducing signal light of an optical disk, and the band limiting capacitor may have a capacitance C expressed by the following inequality:

$$C > (1+hFE)/(2 \times \pi \times Rf \times f),$$

where hFE is a direct current amplification factor of the grounded-emitter transistor, Rf is a resistance of the feedback resistor in use, and f is a reproducing signal frequency of the optical disk.

According to the arrangement, it is possible to reduce the noise at the reproducing signal frequency.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light receiving amplifier circuit comprising:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the band limiting capacitor being connected between the output node of the grounded-emitter amplifier circuit and a grounded point where the emitter is grounded.

2. The light receiving amplifier according to claim 1, wherein:
the received light of the light receiving element serves as reproducing signal light of an optical disk, and
the band limiting capacitor has a capacitance allowing reduction in gain of the reference voltage supplying amplifier in a reproducing signal band of the optical disk.

3. The light receiving amplifier according to claim 1, wherein:
the received light of the light receiving element serves as reproducing signal light of an optical disk, and
the band limiting capacitor has a capacitance C expressed by the following inequality:

$$C > 1/(2 \times \pi \times r \times f),$$

where r is an impedance at the output node of the grounded-emitter amplifier circuit and f is a reproducing signal frequency of the optical disk.

4. The light receiving amplifier according to claim 1, wherein the grounded-emitter amplifier circuit has a constant current source serving as an active load of the grounded-emitter transistor, and the constant current source of the grounded-emitter amplifier circuit has a current to be switched according to a resistance of the feedback resistor in use.

5. The light receiving amplifier according to claim 4, wherein the current of the constant current source of the grounded-emitter amplifier circuit is switched so as to decrease for increase of the resistance of the feedback resistor.

6. The light receiving amplifier according to claim 1, wherein each of the current-to-voltage conversion circuit and the reference voltage supplying amplifier further comprises:
an emitter follower circuit receiving, as an input, an output from the output node of the grounded-emitter amplifier circuit,
the emitter follower circuit including a transistor and a constant current source serving as an active load of the transistor, and
the constant current source having a current to be switched according to a resistance of the feedback resistor in use.

7. The light receiving amplifier according to claim 6, wherein the current of the constant current source of the emitter follower circuit is switched so as to decrease for increase of the resistance of the feedback resistor.

8. A light receiving amplifier circuit comprising:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the current-to-voltage conversion circuit and the reference voltage supplying amplifier each further including a bias-use constant current source for supplying a bias current to the base, and
the band limiting capacitor being connected between the base and the output node of the grounded-emitter amplifier circuit.

9. The light receiving amplifier circuit according to claim 8, wherein:
each of the current-to-voltage conversion circuit and the reference voltage supplying amplifier further comprises:
a reference constant current source which outputs a constant current equal to a collector current corresponding to the bias current of the grounded-emitter transistor; a first current mirror circuit which conducts the constant current of the reference constant current source; a second current mirror circuit which conducts the current outputted from the first current mirror circuit; a bias current generating transistor which generates a base current equal to the bias current by using, as a collector current, the current outputted by the first current mirror circuit; and a third current mirror circuit which conducts the base current generated by the bias current generating transistor,
a current outputted from the second current mirror circuit is a current outputted from an active load of the grounded-emitter transistor, and
a current outputted from the third current mirror circuit is the bias current outputted from the bias-use constant current source.

10. The light receiving amplifier circuit according to claim 8, wherein:
the received light of the light receiving element serves as reproducing signal light of an optical disk, and
the band limiting capacitor has a capacitance allowing reduction in gain of the reference voltage supplying amplifier in a reproducing signal band of the optical disk.

11. The light receiving amplifier according to claim 8, wherein:
the received light of the light receiving element serves as reproducing signal light of an optical disk, and
the band limiting capacitor has a capacitance C expressed by the following inequality:

$$C > 1/(2 \times \pi \times Rf \times f),$$

where Rf is a resistance of the feedback resistor in use and f is a reproducing signal frequency of the optical disk.

12. A light receiving amplifier circuit comprising:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the current-to-voltage conversion circuit and the reference voltage supplying amplifier each further including a bias-use constant current source for supplying a bias current to the base, and
the band limiting capacitor being connected between the base and a grounded point where the emitter is grounded.

13. The light receiving amplifier according to claim 12, wherein:
the received light of the light receiving element serves as reproducing signal light of an optical disk, and
the band limiting capacitor has a capacitance C expressed by the following inequality:

$$C > (1+hFE)/(2 \times \pi \times Rf \times f),$$

where hFE is a direct current amplification factor of the grounded-emitter transistor, Rf is a resistance of the feedback resistor in use, and f is a reproducing signal frequency of the optical disk.

14. A light receiving amplifier circuit comprising:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the current-to-voltage conversion circuit and the reference voltage supplying amplifier each further including a bias-use constant current source for supplying a bias current to the base, and
the band limiting capacitor being connected in parallel to the feedback resistors.

15. An optical pickup device comprising a light receiving amplifier circuit as a light receiving amplifier used for optical pickup of an optical disk, the light receiving amplifier circuit including:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the band limiting capacitor being connected between the output node of the grounded-emitter amplifier circuit and a grounded point where the emitter is grounded.

16. An optical pickup device comprising a light receiving amplifier circuit as a light receiving amplifier used for optical pickup of an optical disk, the light receiving amplifier circuit including:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the current-to-voltage conversion circuit and the reference voltage supplying amplifier each further including a bias-use constant current source for supplying a bias current to the base, and
the band limiting capacitor being connected between the base and the output node of the grounded-emitter amplifier circuit.

17. An optical pickup device comprising a light receiving amplifier circuit as a light receiving amplifier used for optical pickup of an optical disk, the light receiving amplifier circuit including:
a light receiving element which converts received light into a current and outputs the current thus converted;
a current-to-voltage conversion circuit which converts the output current of the light receiving element into a voltage;
a reference voltage supplying amplifier having an identical structure with the current-to-voltage conversion circuit except that the light receiving element is not connected and a band limiting capacitor is provided; and
a differential amplifier circuit which amplifies a difference between the output voltage of the current-to-voltage conversion circuit and a reference voltage that is an output voltage of the reference voltage supplying amplifier,
the current-to-voltage conversion circuit and the reference voltage supplying amplifier each including:
a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and
a plurality of feedback resistors being provided in parallel on feedback paths from the output terminal to the base so as to be selectively used,
the current-to-voltage conversion circuit and the reference voltage supplying amplifier each further including a bias-use constant current source for supplying a bias current to the base, and
the band limiting capacitor being connected between the base and a grounded point where the emitter is grounded.

18. An optical pickup device comprising a light receiving amplifier circuit as a light receiving amplifier used for optical pickup of an optical disk, the light receiving amplifier circuit including:
a light receiving element which converts received light into a current and outputs the current thus converted;

a current-to-voltage conversion circuit which converts the output current of the light receiving element into a voltage;

a reference voltage supplying amplifier having an identical structure with the current-to-voltage conversion circuit except that the light receiving element is not connected and a band limiting capacitor is provided; and a differential amplifier circuit which amplifies a difference between the output voltage of the current-to-voltage conversion circuit and a reference voltage that is an output voltage of the reference voltage supplying amplifier, the current-to-voltage conversion circuit and the reference voltage supplying amplifier each including:

a grounded-emitter amplifier circuit employing a grounded-emitter transistor, the grounded-emitter transistor having a base serving as an input terminal, and a terminal serving as an output terminal for obtaining an output voltage which varies depending on an output from an output node of the grounded-emitter amplifier circuit; and a plurality of feedback resistors being provided in parallel on feedback paths from the output terminal to the base so as to be selectively used, the current-to-voltage conversion circuit and the reference voltage supplying amplifier each further including a bias-use constant current source for supplying a bias current to the base, and the band limiting capacitor being connected in parallel to the feedback resistors.

* * * * *